US007005896B2

(12) United States Patent  (10) Patent No.: US 7,005,896 B2
Chen et al.  (45) Date of Patent: Feb. 28, 2006

(54) HIGH-SPEED LOW-NOISE CHARGE PUMP

(75) Inventors: Chun-Chieh Chen, Hsin-Tien (TW); Jyh-Fong Lin, Hsin-Tien (TW)

(73) Assignee: Via Technologies, Inc., Taipei (TW)

( * ) Notice: Subject to any disclaimer, the term of this patent is extended or adjusted under 35 U.S.C. 154(b) by 15 days.

(21) Appl. No.: 10/671,654

(22) Filed: Sep. 29, 2003

(65) Prior Publication Data

US 2005/0068090 A1   Mar. 31, 2005

(51) Int. Cl.
*H03L 7/093* (2006.01)
*H03L 7/089* (2006.01)
(52) U.S. Cl. .......................... 327/112; 327/157; 331/16
(58) Field of Classification Search ................ 327/112, 327/148, 157; 331/16, 114
See application file for complete search history.

(56) References Cited

U.S. PATENT DOCUMENTS

| 5,952,884 | A | * | 9/1999 | Ide ............................... 330/288 |
| 6,043,716 | A | * | 3/2000 | Warner .......................... 331/17 |
| 6,052,015 | A | * | 4/2000 | Desbonnets .................. 327/382 |
| 6,160,432 | A | * | 12/2000 | Rhee et al. .................. 327/157 |
| 6,169,456 | B1 | * | 1/2001 | Pauls .......................... 330/288 |
| 6,392,494 | B1 | * | 5/2002 | Takeyabu et al. ............. 331/11 |
| 6,586,976 | B1 | * | 7/2003 | Yang .......................... 327/157 |
| 6,677,789 | B1 | * | 1/2004 | Svärd .......................... 327/157 |

* cited by examiner

*Primary Examiner*—Timothy P. Callahan
*Assistant Examiner*—Terry L. Englund
(74) *Attorney, Agent, or Firm*—Rabin & Berdo, PC

(57) ABSTRACT

A high-speed, low-noise charge pump for use in a phase-locked loop. The charge pump is constituted by first and second cascode current mirrors, as well as first and second switching transistors. The first cascode current mirror includes a first output mirror transistor and a first output cascode transistor. The first switching transistor is interposed between the first output mirror and the first output cascode transistors. During assertion of a first control signal, the first switching transistor is turned on so a first mirror current can flow through an output node. Likewise, the second cascode current mirror includes a second output mirror transistor and a second output cascode transistor. The second switching transistor is interposed between the second output mirror and the second output cascode transistors. During assertion of a second control signal, the second switching transistor is turned on so the second mirror current can flow through the output node.

16 Claims, 5 Drawing Sheets

HIGH-SPEED LOW-NOISE CHARGE PUMP

BACKGROUND OF THE INVENTION

1. Field of the Invention

The invention relates to a charge-pump circuit, and more particularly to a high-speed, low-noise charge pump for use in a phase-locked loop (PLL).

2. Description of the Related Art

In recent years, the rapid growth of cellular communications systems has motivated an increasing demand for high performance integrated radio frequency (RF) components. One of the most important building blocks of these systems is the local oscillator (LO). The need for a well defined and highly stable signal for the local oscillator makes necessary the use of phase-locked loop (PLL) techniques to satisfy the stringent requirements of wireless standards. With reference to FIG. 1, a block diagram of a typical PLL 100 is illustrated. Briefly, the PLL 100 includes a phase detector 110, a charge pump 120, a loop filter 130, a voltage-controlled oscillator (VCO) 140 and a frequency divider 150. The PLL 100 receives a reference clock signal $CLK_{ref}$ having a frequency $F_{ref}$ and generates an output clock signal $CLK_{out}$ having a frequency $F_{out}$ that is synchronized with the reference clock signal $CLK_{ref}$ in phase.

The reference clock signal $CLK_{ref}$ is fed to the phase detector 110, where it is compared with a feedback signal $CLK'_{out}$. Based on this comparison, the phase detector 110 generates a pump-up signal UP and a pump-down signal DN which, in turn, direct the charge pump 120 to either deposit charges on or remove charges from the loop filter 130 where a voltage $V_c$ is developed for adjusting the output frequency of the VCO 140. The output of the VCO 140, which is the output of the PLL 100, is coupled to the frequency divider 150. The feedback signal $CLK'_{out}$ may be the same as the output clock signal $CLK_{out}$ from the VCO 140, or as illustrated in FIG. 1 the feedback signal $CLK'_{out}$ may be the output of the frequency divider 150. Although the frequency divider 150 is commonly used in the PLL 100 to divide the frequency received from the VCO 140 by N, it may be eliminated in certain applications.

The charge pump 120 generates a current $I_{CP}$ that controls the output frequency of the VCO 140. The current $I_{CP}$ is dependent on the UP and DN signals from the phase detector 110. When the rising edge of $CLK_{ref}$ leads the rising edge of $CLK+_{out}$, the charge pump 120 increases $I_{CP}$ to develop a larger $V_c$ across the loop filter 130 which, in turn, cause the VCO 140 to increase the frequency of $CLK_{out}$. Conversely, when $CLK_{ref}$ lags behind $CLK'_{out}$, the charge pump 120 decreases $I_{CP}$ to develop a smaller $V_c$ across the loop filter 130 which, in turn, cause the VCO 140 to decrease the frequency of $CLK_{out}$. When the feedback frequency $F'_{out}$ is ultimately locked onto the reference frequency $F_{ref}$, i.e. the phases of the two signals $CLK_{ref}$, $CLK'_{out}$ are aligned, the voltage $V_c$ is not adjusted and the output frequency $F_{out}$ is kept constant. In this state, the charge-pump PLL 100 is said to be in a "locked" condition.

With reference to FIG. 2, a schematic diagram of a conventional charge pump 220 is illustrated. The charge pump 220 includes a "pump-up" current mirror 222 and an associated switching transistor M25. Also, the charge pump 220 includes a "pump-down" current mirror 224 and an associated switching transistor M26. The switching transistor M25 is connected to the switching transistor M26 at an output node 225. The current mirror 222 includes an input mirror transistor M21 having a gate coupled to the gate of an output mirror transistor M23. The sources of transistors M21 and M23 are coupled to a voltage supply $V_{DD}$. The drain of the transistor M21 is coupled to its gate in order to guarantee that the transistor M21 remains in the saturation region. The drain of the transistor M23 is coupled to the source of the switching transistor M25. In a similar fashion, the current mirror 224 includes an input mirror transistor M22 having a gate coupled to the gate of an output mirror transistor M24. The sources of transistors M22 and M24 are tied together to ground. The drain of the transistor M22 is coupled to its gate and the drain of the transistor M24 is coupled to the source of the switching transistor M26. The drains of switching transistors M25 and M26 are coupled to the output node 225. The transistors M21 and M23 involved in the "pump-up" current mirror 222 as well as the associated switching transistor M25 are implemented with the p-channel MOS transistors. Conversely, the transistors M22 and M24 involved in the "pump-down" current mirror 224 as well as the associated switching transistor M26 are the n-channel MOS transistors.

A reference current source 226 providing a supply current $I_{REF}$ is disposed between the drains of the input mirror transistors M21 and M22. Based on control signals applied to the gates of the switching transistors M25 and M26 by a phase detector (which would be connected to the charge pump 220 as shown in FIG. 1), the supply current $I_{REF}$ is mirrored through either the "pump-up" current mirror 222 or through the "pump-down" current mirror 224 to direct an output current $I_{CP}$ to or from the output node 225. When a control signal UP is asserted, the switching transistor M25 is turned on and the supply current $I_{REF}$ is mirrored in the M23–M25 branch. The current mirror 222 thereby provides a "pump-up" current $I_{UP}$ substantially equal to $I_{REF}$. Conversely, when a control signal DN is asserted, the switching transistor M26 is turned on and the supply current $I_{REF}$ is mirrored in the M24–M26 branch. The current mirror 224 thereby provides a "pump-down" current $I_{DN}$ substantially equal to $I_{REF}$. The output current $I_{CP}$ at the output node 225 is the sum of $I_{UP}$ and $I_{DN}$ accordingly.

In RF transmitters, it is desirable to employ a charge pump capable of providing a relatively high switching speed. Nevertheless, the conventional charge pump 220 suffers from high switching noise while operating at higher speed. In addition to high switching noise, the use of the conventional charge pump 220 limits the range of voltages over which the output current may be generated. This results from the lower output impedance of the current mirrors 222 and 224. Therefore, the conventional charge pump 220 is not applicable to high-speed applications. To address these disadvantages, a source-switched charge pump having cascoded output is disclosed in U.S. Pat. No. 6,160,432 granted to Rhee et al. on Dec. 12, 2000. It is shown that Rhee's charge pump enhances the isolation of switching noise. However, the switching speed is still not high enough because Rhee's charge pump requires a considerable turn-on time to deal with a large amount of charge accumulation on the parasitic capacitance of MOS transistors. Furthermore, Rhee's charge pump may have a current matching problem caused by variations of manufacturing process.

In view of the above, what is needed is a high-speed low-noise charge pump that overcomes the disadvantages of the prior art.

SUMMARY OF THE INVENTION

It is an object of the present invention to provide a charge pump suitable for wireless communications, which features high switching speed, low switching noise and better current matching.

The present invention is generally directed to a charge pump for use in a PLL. According to one aspect of the invention, the charge pump includes an output node, first and second cascode current mirrors. The first cascode current mirror, including a first output mirror transistor and a first output cascode transistor, is coupled to a reference current source and generates a first mirror current. The second cascode current mirror generates a second mirror current and is coupled to the first cascode current mirror at the output node. A first switching transistor is interposed between the first output mirror and the first output cascode transistors. A first control signal is applied to the first switching transistor. When the first control signal is asserted, the first switching transistor is turned on and causes the first mirror current to flow through the output node. On the other hand, a second switching transistor is imposed on a second control signal. When the second control signal is asserted, the second switching transistor is turned on and causes the second mirror current to flow through the output node.

According to another aspect of the invention, a high-speed low-noise charge pump is disclosed. The charge pump includes an output node and a reference current source that provides a supply current. A first cascade current mirror coupled to the reference current source is adapted to generate a first mirror current from the supply current. The first cascode current mirror includes a first output mirror transistor and a first output cascode transistor. On the other hand, a second cascade current mirror coupled to the reference current source is adapted to generate a second mirror current from the supply current. The second cascade current mirror includes a second output mirror transistor and a second output cascode transistor coupled to the first output cascade transistor at the output node. Additionally, a first switching transistor interposed between the first output mirror and the first output cascode transistors is turned on during assertion of a first control signal to cause the first mirror current to flow through the output node. In a similar fashion, a second switching transistor interposed between the second output mirror and the second output cascode transistors is turned on during assertion of a second control signal to cause the second mirror current to flow through the output node.

In one embodiment of the present invention, a charge pump having an output node is made up of two cascode current mirrors and two switching transistors. A first cascade current mirror, including a first output mirror transistor and a first output cascode transistor, is coupled to a first reference current source and generates a first mirror current. A second cascade current mirror, including a second output mirror transistor and a second output cascode transistor coupled to the first output cascode transistor at the output node, is coupled to a second reference current source and generates a second mirror current. A first switching transistor having a gate, a source and a drain is interposed between the first output mirror and the first output cascode transistors. The source of the first switching transistor is coupled to the first output mirror transistor, the drain of the first switching transistor is coupled to the first output cascode transistor, and the gate of the first switching transistor receives a first control signal. On the other hand, a second switching transistor having a gate, a source and a drain is interposed between the second output mirror and the second output cascode transistors. The source of the second switching transistor is coupled to the second output mirror transistor, the drain of the second switching transistor is coupled to the second output cascode transistor, and the gate of the second switching transistor receives a second control signal. During assertion of the first control signal, the first switching transistor is turned on to cause the first mirror current to flow through the output node. During assertion of the second control signal, the second switching transistor is turned on to cause the second mirror current to flow through the output node.

DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE INVENTION

Figure 1:
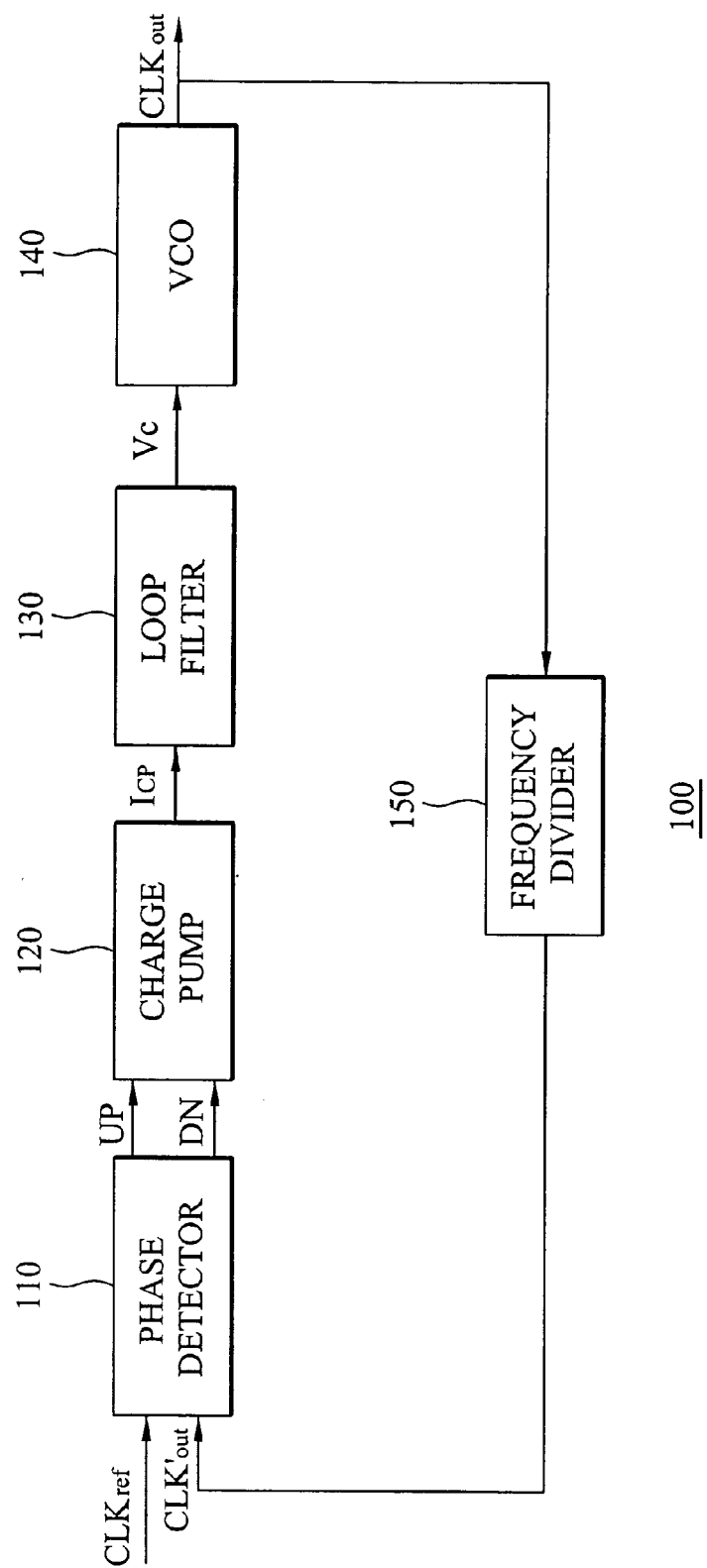
FIG. 1 is a block diagram of a typical PLL.
Figure 2:
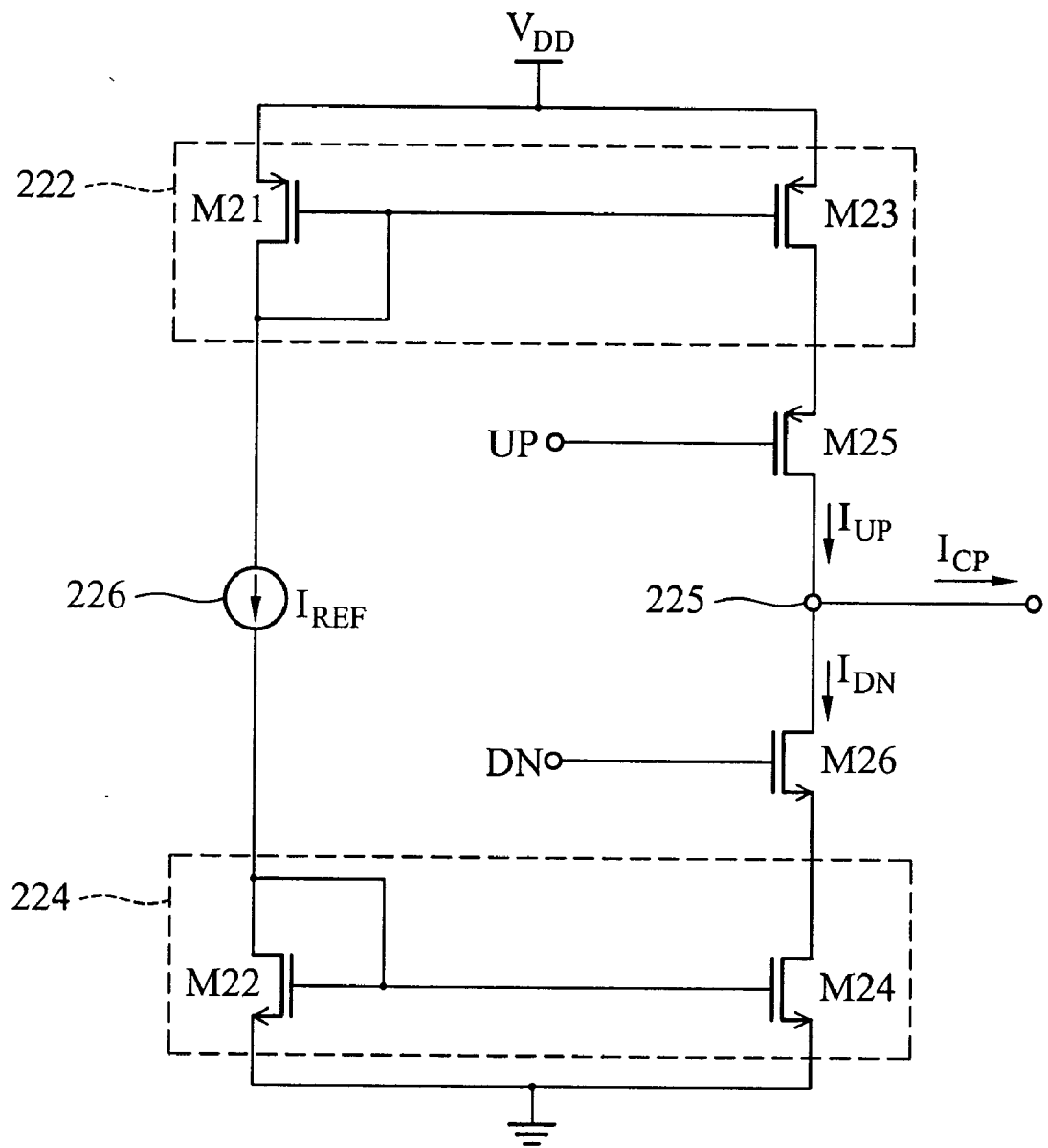
FIG. 2 is a schematic diagram of a conventional charge pump in accordance with the prior art.
Figure 3:
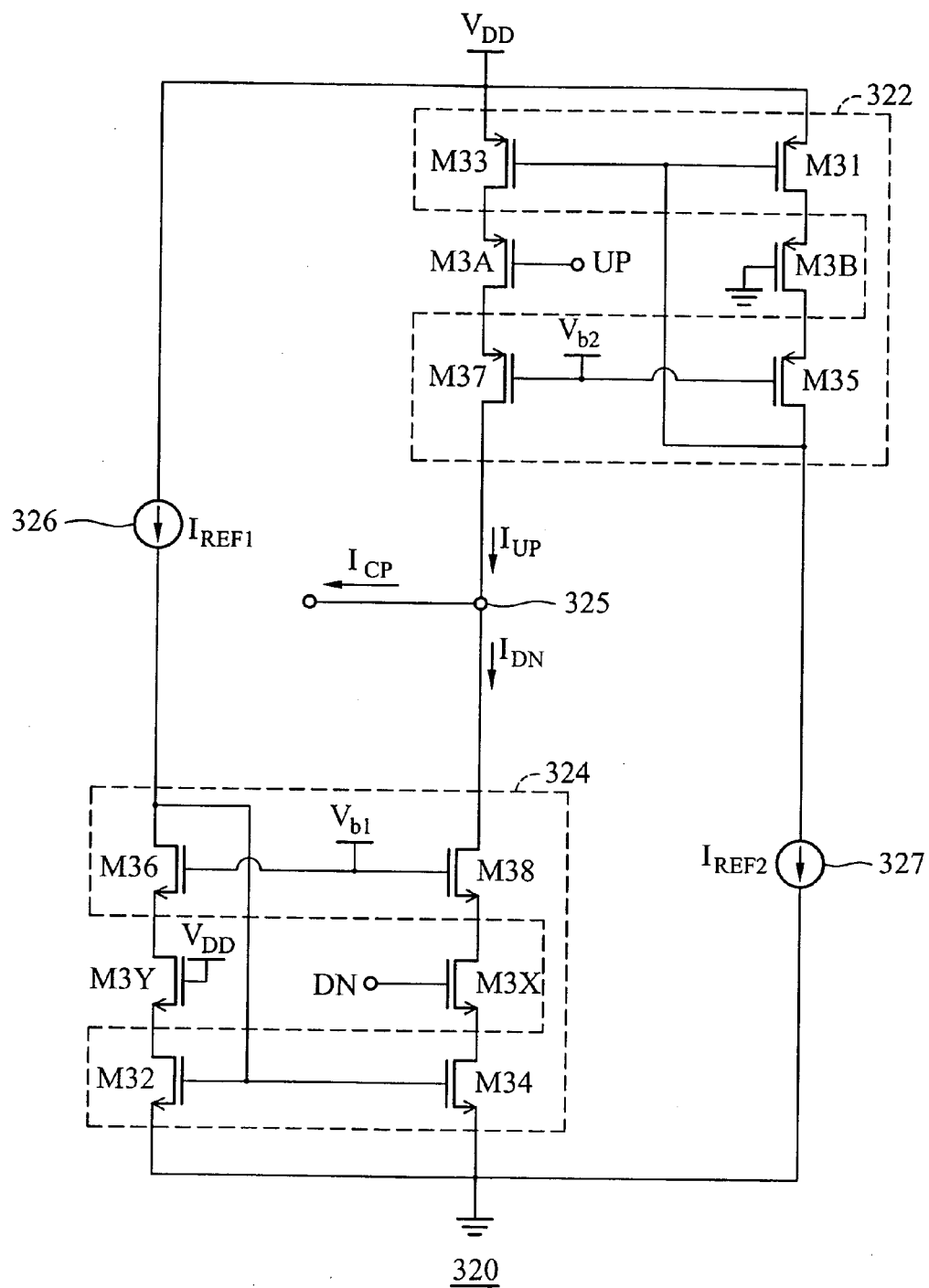
FIG. 3 is a schematic diagram of a charge pump in accordance with an embodiment of the invention.

With reference to FIG. 3, a first embodiment of a charge pump 320 in accordance with the invention is illustrated. Each transistor described herein is either a p-channel or n-channel MOS transistor having a gate, a drain and a source. Since a MOS transistor is typically a symmetrical device, the true designation of "source" and "drain" is only possible once a voltage is impressed on the terminals. The designations of source and drain herein should be interpreted, therefore, in the broadest sense. The charge pump 320 includes a "pump-up" current mirror 322 and an associated switching transistor M3A. A transistor M3B in the branch M31–M35 is the counterpart of the switching transistor M3A. The charge pump 320 also includes a "pump-down" current mirror 324 and an associated switching transistor M3X. Similarly, a transistor M3Y in the branch M32–M36 is the counterpart of the switching transistor M3X. The "pump-down" current mirror 324 is coupled to a reference current source 326 providing a supply current $I_{REF}$, and the "pump-up" current mirror 322 is coupled to a reference current source 327 providing a supply current $I_{REF2}$. The transistors involved in the "pump-up" current mirror 322, the switching transistor M3A and the transistor M3B are fabricated with the p-channel MOS transistors. Conversely, the transistors involved in the "pump-down" current mirror 324, the switching transistor M3X and the transistor M3Y are the n-channel MOS transistors.

In accordance with the invention, the current mirrors 322 and 324 are preferably a wide-swing cascade current mirror that features high output impedance without greatly restricting signal swing. The n-channel wide-swing cascade current mirror 324 is realized by transistors M32, M34, M36 and M38. The switching transistor M3X is interposed between the output mirror transistor M34 and the output cascode transistor M38. The switching transistor M3X has its source coupled to the drain of the output mirror transistor M34, its drain coupled to the source of the output cascode transistor M38, and accepts a control signal DN at its gate. Correspondingly, the transistor M3Y is interposed between the input mirror transistor M32 and the input cascode transistor M36. The transistor M3Y has its source coupled to the drain of the input mirror transistor M32 and its drain coupled to the source of the input cascode transistor M36. The gate of the transistor M3Y is coupled to a high-potential voltage supply, namely $V_{DD}$, in order to bring about conduction in the transistor M3Y continuously. The input mirror transistor M32 has its gate coupled to the gate of the output mirror transistor M34. The sources of transistors M32 and M34 are connected together to a low-potential voltage supply, namely ground. The output cascode transistor M38 has its drain coupled to an output node 325. The input cascode transistor M36 has its drain coupled to the gate of the input mirror transistor M32. The reference current source 326 is connected to the drain of the input cascode transistor M36. The gates of transistors M36 and M38 are connected together. The transistors M36 and M38 both have gate voltages established by a bias voltage $V_{B1}$. The bias voltage $V_{B1}$ should be sufficient to turn on the cascode transistors M36 and M38.

In a similar fashion, the p-channel wide-swing cascode current mirror 322 is realized by transistors M31, M33, M35 and M37. The switching transistor M3A is interposed between the output mirror transistor M33 and the output cascode transistor M37. The switching transistor M3A has its source coupled to the drain of the output mirror transistor M33, its drain coupled to the source of the output cascode transistor M37, and accepts a control signal UP at its gate. Correspondingly, the transistor M3B is interposed between the input mirror transistor M31 and the input cascode transistor M35. The transistor M3B has its source coupled to the drain of the input mirror transistor M31 and its drain coupled to the source of the input cascode transistor M35. The gate of the transistor M3B is coupled to the low-potential voltage supply, namely ground, in order to bring about conduction in the transistor M3B continuously. The input mirror transistor M31 has its gate coupled to the gate of the output mirror transistor M33. The sources of transistors M31 and M33 are connected together to $V_{DD}$. The output cascode transistor M37 has its drain coupled to the drain of the output cascode transistor M38 at the output node 325. The input cascode transistor M35 has its drain coupled to the gate of the input mirror transistor M31. The reference current source 327 is connected to the drain of the input cascode transistor M35. The gates of transistors M35 and M37 are connected together. The transistors M35 and M37 both have gate voltages established by a bias voltage $V_{B2}$. The bias voltage $V_{B2}$ should be sufficient to turn on the cascode transistors M35 and M37.

In response to the control signals UP and DN, the charge pump 320 direct an output current $I_{CP}$ to or from the output node 325. When the control signal UP is asserted, the switching transistor M3A is turned on and the supply current $I_{REF2}$ is mirrored in the M33–M37 branch towards the output node 325. The current mirror 322 thereby delivers a "pump-up" current $I_{UP}$ substantially equal to $I_{REF2}$. Conversely, when the control signal DN is asserted, the switching transistor M3X is turned on and the supply current $I_{REF1}$ is mirrored in the M34–M38 branch away from the output node 325. The current mirror 324 thereby draws a "pump-down" current $I_{DN}$ substantially equal to $I_{REF1}$. It is noted that the output current $I_{CP}$ at the output node 325 is the sum of $I_{UP}$ and $I_{DN}$.

Figure 4:
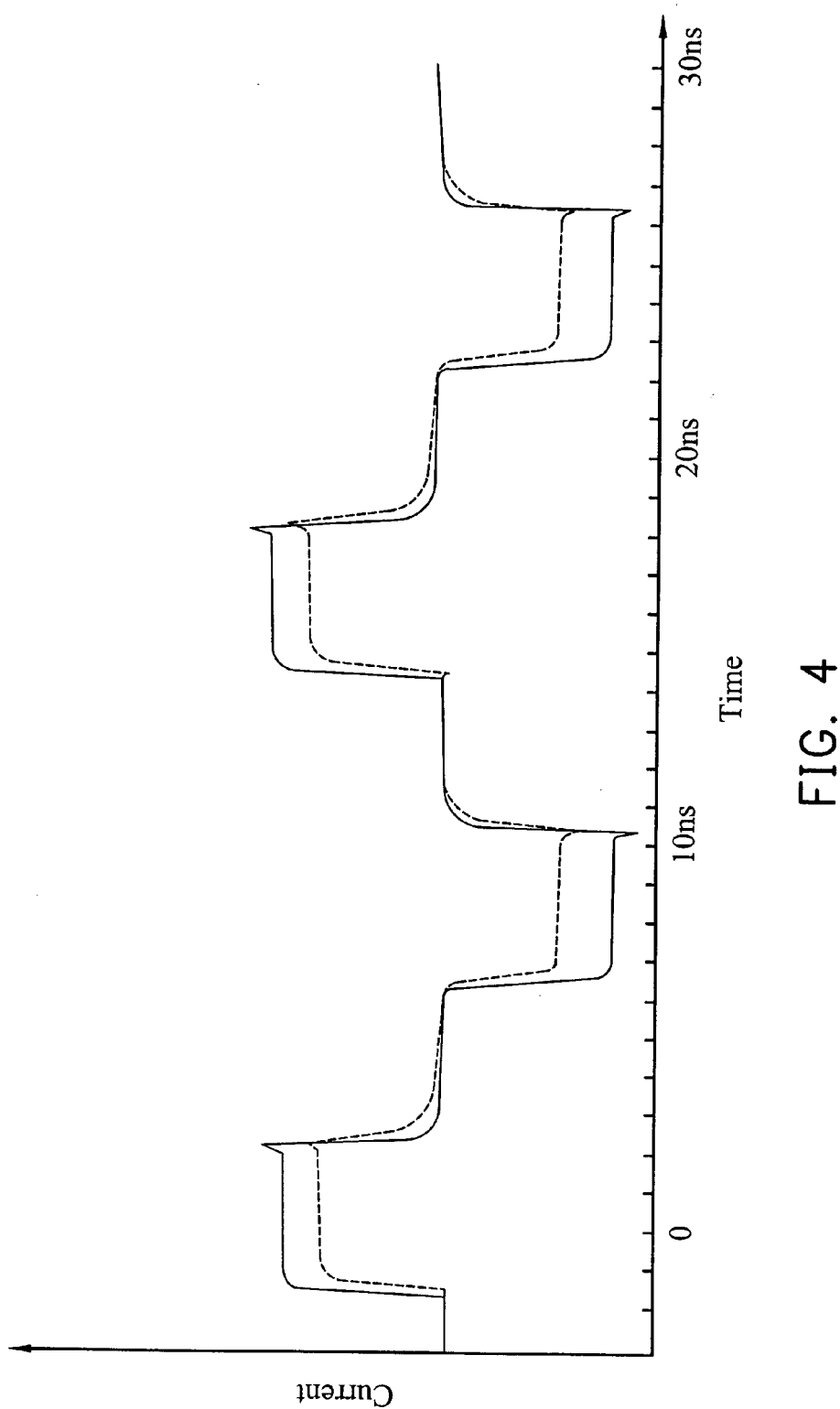
FIG. 4 is a graph of a simulation result containing the prior art and the present invention.

The reason for including the cascode transistors is to increase the output impedance of the current mirrors 322 and 324. Thus the variation of output current $I_{CP}$ is less dependent on the output voltage and the voltage range over which the output current $I_{CP}$ is generated can be improved. It should be noted that the switching transistors M3A and M3X are coupled to respective transistors M37 and M38 in cascode rather than directly to the output node 325 so that switching noise from operation of the switches is isolated from the output node 325. Furthermore, the effective gate-source voltage of each output mirror transistor is well matched in the arrangement of the charge pump 320 by the principles of the invention. This leads to a more accurate matching in the mirror current. By analysis and simulation, it is found that the charge pump of the invention causes less charge accumulation on the parasitic capacitance than the one proposed in U.S. Pat. No. 6,160,432, which effectively results in a reduction of the turn-on time. FIG. 4 demonstrates the simulation result comparing the invention and the prior art. In the simulation, the operating speed is assumed to be 125 MHz. The output current of the invention is plotted with the solid line while the output current of U.S. Pat. No. 6,160,432 is plotted with the dash line. From FIG. 4, it can be seen that the magnitude of the current swing of the invention is greater than that of the prior art approximately. Compared to the prior art, therefore, the present invention provides a charge pump having high switching speed, low switching noise and better current matching.

Figure 5:
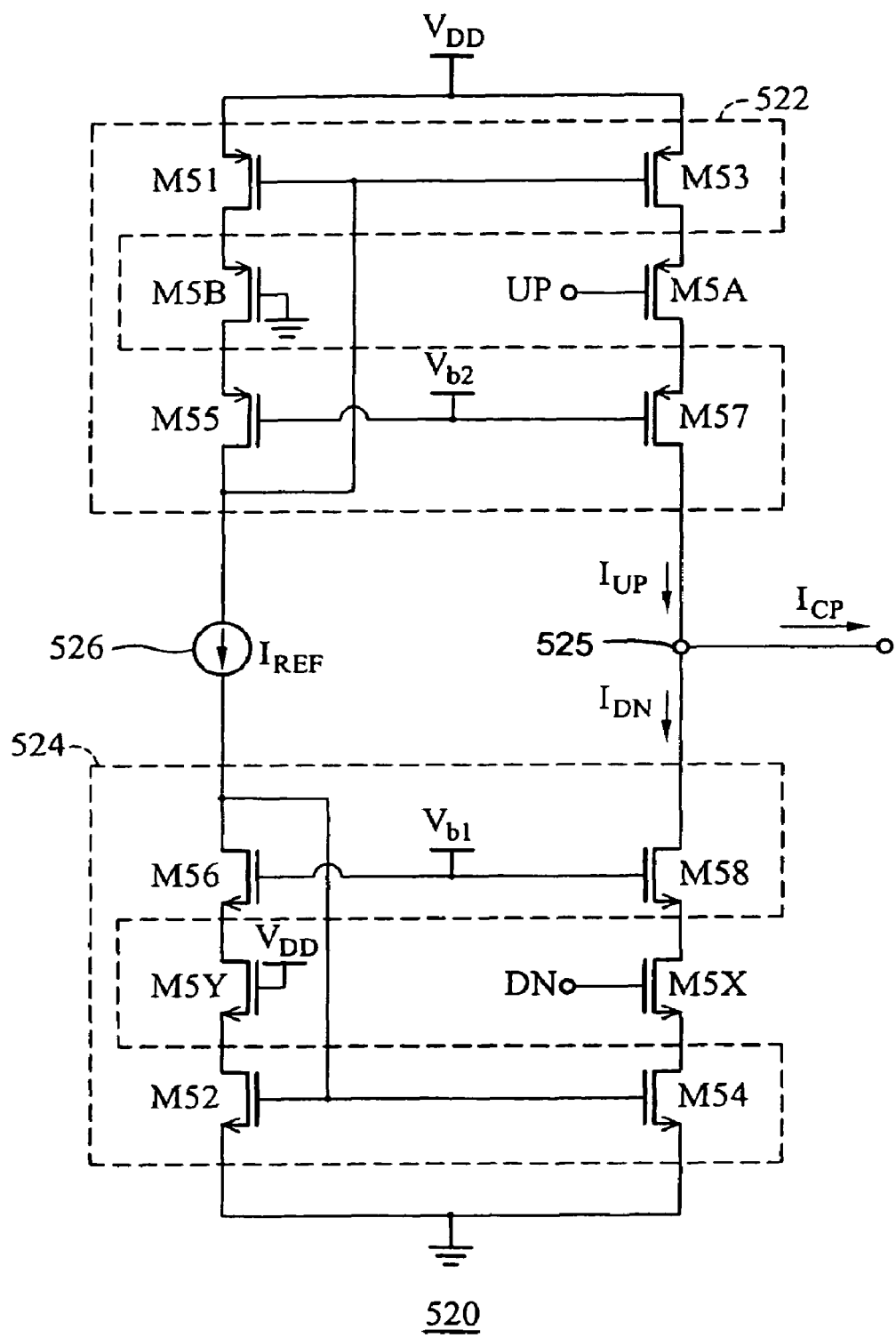
FIG. 5 is a schematic diagram of a charge pump in accordance with another embodiment of the invention.

Turning now to FIG. 5, another embodiment of the invention is illustrated. As depicted, a charge pump 520 includes a "pump-up" current mirror 522 and an associated switching transistor M5A. A transistor M5B in the branch M51–M55 is the counterpart of the switching transistor M5A. The charge pump 520 also includes a "pump-down" current mirror 524 and an associated switching transistor M5X. As well, a transistor M5Y in the branch M52–M56 is the counterpart of the switching transistor M5X. The "pump-up" and "pump-down" current mirrors 522 and 524 are both coupled to a reference current source 526 providing a supply current $I_{REF}$. The transistors involved in the "pump-up" current mirror 522, the switching transistor M5A and the transistor M5B are fabricated with the p-channel MOS transistors. Conversely, the transistors involved in the "pump-down" current mirror 524, the switching transistor M5X and the transistor M5Y are the n-channel MOS transistors.

In accordance with the invention, the current mirrors 522 and 524 are preferably a wide-swing cascode current mirror that features high output impedance without greatly restricting signal swing. The n-channel wide-swing cascode current mirror 524 is made up of transistors M52, M54, M56 and M58. The switching transistor M5X is interposed between the output mirror transistor M54 and the output cascode transistor M58. The switching transistor M5X has its source coupled to the drain of the output mirror transistor M54, its drain coupled to the source of the output cascode transistor M58, and accepts a control signal DN at its gate. Correspondingly, the transistor M5Y is interposed between the input mirror transistor M52 and the input cascode transistor M56. The transistor M5Y has its source coupled to the drain of the input mirror transistor M52 and its drain coupled to the source of the input cascode transistor M56. The gate of the transistor M5Y is coupled to a high-potential voltage supply, namely $V_{DD}$, in order to bring about conduction in the transistor M5Y continuously. The input mirror transistor M52 has its gate coupled to the gate of the output mirror transistor M54. The sources of transistors M52 and M54 are connected together to a low-potential voltage supply, namely ground. The output cascode transistor M58 has its drain coupled to an output node 525. The input cascode transistor M56 has its drain coupled to the gate of the input mirror transistor M52. The reference current source 526 is connected to the drain of the input cascode transistor M56. The gates of transistors M56 and M58 are connected together. The transistors M56 and M58 both have gate voltages established by a bias voltage $V_{B1}$. The bias voltage $V_{B1}$ should be sufficient to turn on the cascode transistors M56 and M58.

In a similar fashion, the p-channel wide-swing cascade current mirror 522 is made up of transistors M51, M53, M55 and M57. The switching transistor M5A is interposed between the output mirror transistor M53 and the output cascode transistor M57. The switching transistor M5A has its source coupled to the drain of the output mirror transistor M53, its drain coupled to the source of the output cascode transistor M57, and accepts a control signal UP at its gate. Correspondingly, the transistor M5B is interposed between the input mirror transistor M51 and the input cascode transistor M55. The transistor M5B has its source coupled to the drain of the input mirror transistor M51 and its drain coupled to the source of the input cascode transistor M55. The gate of the transistor M5B is coupled to the low-potential voltage supply, namely ground, in order to bring about conduction in the transistor M5B continuously. The input mirror transistor M51 has its gate coupled to the gate of the output mirror transistor M53. The sources of transistors M51 and M53 are connected together to $V_{DD}$. The output cascode transistor M57 has its drain coupled to the drain of the output cascode transistor M58 at the output node 525. The input cascode transistor M55 has its drain coupled to the gate of the input mirror transistor M51. The reference current source 526 is connected to the drain of the input cascode transistor M55. The gates of transistors M55 and M57 are connected together. The transistors M55 and M57 both have gate voltages established by a bias voltage $V_{B2}$. The bias voltage $V_{B2}$ should be sufficient to turn on the cascode transistors M55 and M57.

In response to the control signals UP and DN, the charge pump 520 direct an output current $I_{CP}$ to or from the output node 525. During assertion of the control signal UP, the switching transistor M5A is turned on and the supply current $I_{REF}$ is mirrored in the M53–M57 branch towards the output node 525. The current mirror 522 thereby delivers a "pump-up" current $I_{UP}$ substantially equal to $I_{REF}$. During assertion of the control signal DN, the switching transistor M5X is turned on and the supply current $I_{REF}$ is mirrored in the M54–M58 branch away from the output node 525. The current mirror 524 thereby draws a "pump-down" current $I_{DN}$ substantially equal to $I_{REF}$. Note that the output current $I_{CP}$ at the output node 525 is the sum of $I_{UP}$ and $I_{DN}$. It should be understood to those skilled in the art that other transistor technologies are contemplated to implement the transistors illustrated in FIGS. 3 and 5 by the principles of the invention.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high-speed low-noise charge pump comprising:
an output node;
a first cascode current mirror coupled to a first reference current source and adapted to generate a first mirror current, including:
   a first output mirror transistor and a first output cascode transistor;
   a first input mirror transistor coupled to the first output mirror transistor and ground; and
   a first input cascode transistor coupled to the first output mirror transistor and the first reference current source;
a second cascode current mirror coupled to a second reference current source and adapted to generate a second mirror current, including:
   a second output mirror transistor and a second output cascode transistor coupled to the first output cascode transistor at the output node;
   a second input mirror transistor coupled to the second output mirror transistor and a voltage supply; and
   a second input cascode transistor coupled to the second output cascode transistor and the second reference current source;
a first switching transistor being turned on during assertion of a first control signal to cause the first mirror current to flow through the output node, having a gate, a source and a drain where the source of the first switching transistor is coupled to the first output mirror transistor, the drain of the first switching transistor is coupled to the first output cascode transistor, and the gate of the first switching transistor receives the first control signal; and
a second switching transistor being turned on during assertion of a second control signal to cause the second mirror current to flow through the output node, having a gate, a source and a drain where the source of the second switching transistor is coupled to the second output mirror transistor, the drain of the second switching transistor is coupled to the second output cascode transistor, and the gate of the second switching transistor receives the second control signal, and
wherein the first input mirror transistor has a gate coupled to the first output mirror transistor and a source coupled to the ground;
wherein the first input cascode transistor has a gate coupled to the first output cascode transistor and a drain coupled to the gate of the first input mirror transistor and the first reference current source;
wherein the second input mirror transistor has a gate coupled to the second output mirror transistor and a source coupled to the voltage supply; and
wherein the second input cascode transistor has a gate coupled to the second output cascode transistor and a drain coupled to the gate of the second input mirror transistor and the second reference current source.

2. The charge pump as recited in claim 1 wherein:
the first output mirror, the first output cascode and the first switching transistors are n-channel MOS transistors; and
the second output mirror, the second output cascode, and the second switching transistors are p-channel MOS transistors.

3. The charge pump as recited in claim 2 wherein:
the first output mirror transistor has a drain coupled to the source of the first switching transistor and a source coupled to ground;

the first output cascode transistor has a source coupled to the drain of the first switching transistor and a drain coupled to the output node;

the second output mirror transistor has a drain coupled to the source of the second switching transistor and a source coupled to the voltage supply; and the second output cascode transistor has a source coupled to the drain of the second switching transistor and a drain coupled to the first output cascode transistor at the output node.

4. The charge pump as recited in claim 1 wherein the first and the second cascode current mirrors are wide-swing cascode current mirrors featuring high output impedance without greatly restricting a signal swing.

5. The charge pump as recited in claim 4 wherein:
the first input mirror and the first input cascode transistors are n-channel MOS transistors; and
the second input mirror and the second input cascode transistors are p-channel MOS transistors.

6. A high-speed low-noise charge pump comprising:
an output node;
a reference current source providing a supply current;
a first cascode current mirror coupled to the reference current source and adapted to generate a first mirror current from the supply current, including:
  a first output mirror transistor and a first output cascode transistor;
  a first input mirror transistor coupled to the first output mirror transistor and a first voltage supply; and
  a first input cascode transistor coupled to the first output cascode transistor and the reference current source;
a second cascode current mirror coupled to the reference current source and adapted to generate a second mirror current from the supply current, including:
  a second output mirror transistor and a second output cascode transistor coupled to the first output cascode transistor at the output node;
  a second input mirror transistor coupled to the second output mirror transistor and a second voltage supply; and
  a second input cascode transistor coupled to the second output cascode transistor and the reference current source;
a first switching transistor interposed between the first output mirror and the first output cascode transistors, being turned on during assertion of a first control signal to cause the first mirror current to flow through the output node; and
a second switching transistor interposed between the second output mirror and the second output cascode transistors, being turned on during assertion of a second control signal to cause the second mirror current to flow through the output node,
wherein the first input cascode transistor has a gate coupled to the first output cascode transistor and a drain coupled to the gate of the first input mirror transistor and the reference current source; and
the second input cascode transistor has a gate coupled to the second output cascode transistor and a drain coupled to the gate of the second input mirror transistor and the reference current source.

7. The charge pump as recited in claim 6 wherein:
the first switching transistor has a gate, a source and a drain, where the source of the first switching transistor is coupled to the first output mirror transistor, the drain of the first switching transistor is coupled to the first output cascode transistor, and the gate of the first switching transistor receives the first control signal; and
the second switching transistor has a gate, a source and a drain, where the source of the second switching transistor is coupled to the second output mirror transistor, the drain of the second switching transistor is coupled to the second output cascode transistor, and the gate of the second switching transistor receives the second control signal.

8. The charge pump as recited in claim 7 wherein:
the first output mirror, the first output cascode and the first switching transistors are n-channel MOS transistors; and
the second output mirror, the second output cascode, and the second switching transistors are p-channel MOS transistors.

9. The charge pump as recited in claim 8 wherein:
the first output mirror transistor has a drain coupled to the source of the first switching transistor and a source coupled to the first voltage supply;
the first output cascode transistor has a source coupled to the drain of the first switching transistor and a drain coupled to the output node;
the second output mirror transistor has a drain coupled to the source of the second switching transistor and a source coupled to the second voltage supply; and
the second output cascode transistor has a source coupled to the drain of the second switching transistor and a drain coupled to the first output cascode transistor at the output node.

10. The charge pump as recited in claim 7 wherein the first and the second cascode current mirrors are wide-swing cascode current mirrors featuring high output impedance without greatly restricting signal swing.

11. The charge pump as recited in claim 10 wherein:
the first input mirror and the first input cascode transistors are n-channel MOS transistors; and
the second input mirror and the second input cascode transistors are p-channel MOS transistors.

12. The charge pump as recited in claim 11 wherein:
the first input mirror transistor has a gate coupled to the first output mirror transistor and a source coupled to the first voltage supply; and
the second input mirror transistor has a gate coupled to the second output mirror transistor and a source coupled to the second voltage supply.

13. A high-speed low-noise charge pump having an output node, comprising:
a first cascode current mirror coupled to a reference current source, including:
  a first output mirror transistor and a first output cascode transistor, for generating a first mirror current;
  a first input mirror transistor having a gate coupled to the first output mirror transistor and a source coupled to a voltage supply; and
  a first input cascode transistor having a gate coupled to the first output cascode transistor and a drain coupled to the gate of the first input mirror transistor and the reference current source;
a first switching transistor receiving a first control signal and interposed between the first output mirror and the first output cascode transistors, for causing the first mirror current to flow through the output node when the first control signal is asserted;
a second cascode current mirror coupled to the first cascode current mirror at the output node, for generating a second mirror current; and a second switching transistor receiving a second control signal, for causing the second mirror current to flow through the output node when the second control signal is asserted.

14. The charge pump as recited in claim 13 wherein the first switching transistor has a gate, a source and a drain, where the source of the first switching transistor is coupled to the first output mirror transistor, the drain of the first switching transistor is coupled to the first output cascode transistor, and the gate of the first switching transistor receives the first control signal.

15. The charge pump as recited in claim 14 wherein:
the first output mirror transistor has a drain coupled to the source of the first switching transistor and a source coupled to the voltage supply; and
the first output cascode transistor has a source coupled to the drain of the first switching transistor and a drain coupled to the output node.

16. The charge pump as recited in claim 13 wherein the first and the second cascode current mirrors are wide-swing cascode current mirrors featuring high output impedance without greatly restricting signal swing.

* * * * *